United States Patent
Wang et al.

(10) Patent No.: US 10,826,018 B2
(45) Date of Patent: Nov. 3, 2020

(54) PACKAGE STRUCTURE INCLUDING PACKAGE LAYERS AND MANUFACTURING METHOD THEREOF AND DISPLAY PANEL

(71) Applicant: BOE Technology Group Co., Ltd., Beijing (CN)

(72) Inventors: Tao Wang, Beijing (CN); Jifeng Tan, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/176,353

(22) Filed: Oct. 31, 2018

(65) Prior Publication Data

US 2019/0221773 A1 Jul. 18, 2019

(30) Foreign Application Priority Data

Jan. 15, 2018 (CN) .......................... 2018 1 0036150

(51) Int. Cl.
| | | |
|---|---|---|
| *H01L 29/08* | (2006.01) | |
| *H01L 51/52* | (2006.01) | |
| *H01L 51/56* | (2006.01) | |

(52) U.S. Cl.
CPC .......... *H01L 51/5256* (2013.01); *H01L 51/56* (2013.01)

(58) Field of Classification Search
USPC ........................................................ 257/40
See application file for complete search history.

(56) References Cited

U.S. PATENT DOCUMENTS

| 10,177,344 B2* | 1/2019 | Wang ................... H01L 51/5275 |
| 2003/0168254 A1* | 9/2003 | Kariya ............... H01L 23/49811 |
| | | 174/261 |
| 2014/0036465 A1* | 2/2014 | Hu ......................... H05K 1/181 |
| | | 361/767 |
| 2016/0009068 A1* | 1/2016 | Garner ................... B29C 53/005 |
| | | 156/196 |
| 2017/0155081 A1* | 6/2017 | Zeng ..................... H01L 51/0097 |
| 2018/0301515 A1* | 10/2018 | Huang ................ H01L 27/3211 |

FOREIGN PATENT DOCUMENTS

| CN | 106711184 A | 5/2017 |
| CN | 106848106 A | 6/2017 |

OTHER PUBLICATIONS

First Office Action dated Apr. 3, 2019 corresponding to Chinese application No. 201810036150.6.

* cited by examiner

*Primary Examiner* — Caleb E Henry
(74) *Attorney, Agent, or Firm* — Nath, Goldberg & Meyer; Joshua B. Goldberg

(57) ABSTRACT

A package structure and a manufacturing method thereof, and a display panel are provided, and the package structure comprises a package stack disposed on a substrate; and an additional layer disposed on the package stack. The package structure provided by the present disclosure results in saving of one deposition process and one mask process, thereby the manufacturing process is simplified. Moreover, a narrow bezel may be realized.

19 Claims, 4 Drawing Sheets

PACKAGE STRUCTURE INCLUDING PACKAGE LAYERS AND MANUFACTURING METHOD THEREOF AND DISPLAY PANEL

CROSS-REFERENCE TO RELATED APPLICATION

The present application claims the priority to the Chinese Patent Application No. 201810036150.6, filed on Jan. 15, 2018, the disclosure of which is hereby incorporated by reference in its entirety.

TECHNICAL FIELD

The present disclosure relates to the field of display technology, and more particularly, to a package structure and a manufacturing method thereof, and a display panel.

BACKGROUND

Currently, a liquid crystal display (LCD) or an organic light emitting diode (OLED) display panel may be used to achieve a bendable display. It is easier to realize the bendable display with a smaller bending radius by using the OLED display panel prepared on a flexible substrate. Therefore, the OLED display panel including the flexible substrate has drawn a lot of attention.

SUMMARY

The present disclosure provides a package structure and a manufacturing method thereof, and a display panel.

The package structure of the present disclosure includes:
a package stack disposed on a substrate; and
an additional layer disposed on the package stack.

In some embodiments, an orthographic projection of the additional layer on the substrate coincides with an orthographic projection of the package stack on the substrate.

In some embodiments, the package stack includes at least one set of package layers, each set of package layers includes N+1 inorganic layers and N organic layers, N is a positive integer, and orthographic projections of every two adjacent inorganic layers on the substrate are larger than and completely cover an orthographic projection of an organic layer between the two adjacent inorganic layers on the substrate and the organic layer is completely encased.

In some embodiments, N=1, each set of package layers includes two inorganic layers and one organic layer, and orthographic projections of the two inorganic layers on the substrate are larger than and completely cover an orthographic projection of the organic layer on the substrate.

In some embodiments, N=2, each set of package layers includes three inorganic layers and two organic layers, and one organic layer is disposed between every two adjacent inorganic layers, and orthographic projections of the two adjacent inorganic layers on the substrate are larger than and completely cover an orthographic projection of the organic layer on the substrate.

In some embodiments, a thickness of the inorganic layer ranges from 1000 to 20000 Å.

In some embodiments, the organic layer is made of the same material as the additional layer.

In some embodiments, a thickness of the organic layer ranges from 1 to 20 μm.

In some embodiments, the additional layer is made of an organic material.

In some embodiments, the organic material includes a polyurethane-based material, a siloxane-based material, an acrylate-based material, or photoresist.

In some embodiments, the package structure further includes an OLED device disposed on the substrate, and the package stack encases the OLED device.

In some embodiments, the additional layer is a planarization layer.

The present disclosure also provides a manufacturing method of a package structure, including steps of:
forming a package stack on a substrate;
forming an additional layer on the package stack; and
etching the package stack with the additional layer as a photo mask layer to remove portions of the package stack not covered by the additional layer.

In some embodiments, the additional layer is formed on the package stack by using ink jet printing, screen printing or plasma enhanced chemical vapor deposition.

In some embodiments, the step of forming a package stack on a substrate includes:
forming at least one set of package layers such that each set of package layers includes N+1 inorganic layers and N organic layers, N is a positive integer, and orthographic projections of every two adjacent inorganic layers on the substrate are larger than and completely cover an orthographic projection of an organic layer between the two adjacent inorganic layers on the substrate and the organic layer is completely encased.

In some embodiments, N=1, each set of package layers includes two inorganic layers and one organic layer. Orthographic projections of the two inorganic layers on the substrate are larger than and completely cover an orthographic projection of the organic layer on the substrate.

In some embodiments, N=2, each set of package layers includes three inorganic layers and two organic layers. One organic layer is disposed between every two adjacent inorganic layers, and orthographic projections of the two adjacent inorganic layers on the substrate are larger than and completely cover an orthographic projection of the organic layer on the substrate.

In some embodiments, the inorganic layer is formed by using plasma enhanced chemical vapor deposition, atomic layer deposition or sputter deposition.

In some embodiments, the organic layer is formed by using ink jet printing, screen printing or plasma enhanced chemical vapor deposition.

The present disclosure further provides a display panel, including a substrate and the above package structure provided by the present disclosure, and the package structure is disposed on the substrate.

DETAILED DESCRIPTION

In the technical solutions of the package structure and the manufacturing method thereof, and the display panel provided by the present disclosure, an additional layer is provided on a package stack and the package stack may be etched by using the additional layer as a photo mask layer to form a pattern of the package stack without using a metal mask plate. Thus, one mask processing may be saved and the additional layer may be used as a planarization layer to meet requirements of a subsequent processes such as integration of a touch panel and the like, so that an additional planarization layer is not required, which simplifies the manufacturing procedure. In addition, since the metal mask plate is not required, a film with non-uniform thickness due to the metal mask plate will not be formed, and a narrow bezel may be also realized.

To make those skilled in the art better understand the technical solutions of the present disclosure, the package structure and the manufacturing method thereof, and the display panel provided by the present disclosure will be further described in detail below in conjunction with the accompanying drawings.

Currently, a thin film packaging method is a most common flexible display packaging method, that is, a package layer is used to encase an OLED device on the substrate to block water and oxygen. However, an additional planarization layer is necessary in the prior art to meet the requirements of a subsequent process such as integration of a touch panel, which results in an additional deposition process.

Moreover, during an actual manufacturing procedure, a metal mask plate is also required, that is, the metal mask plate is disposed on a substrate to block some functional regions, such as a binding region, a test region, etc., and the package layer is then deposited on the remaining regions that are not blocked. This not only results in an additional mask process, and but also a region with a film of non-uniform thickness due to the fact that the metal mask plate and the substrate cannot be completely seamlessly fitted with each other, which degrades the package effect. In addition, since the metal mask plate affects movement of plasma during a chemical vapor deposition process, there are also some regions with a film of non-uniform thickness at the edge of the metal mask plate. These regions make it difficult to realize a narrow bezel.

Figure 1:
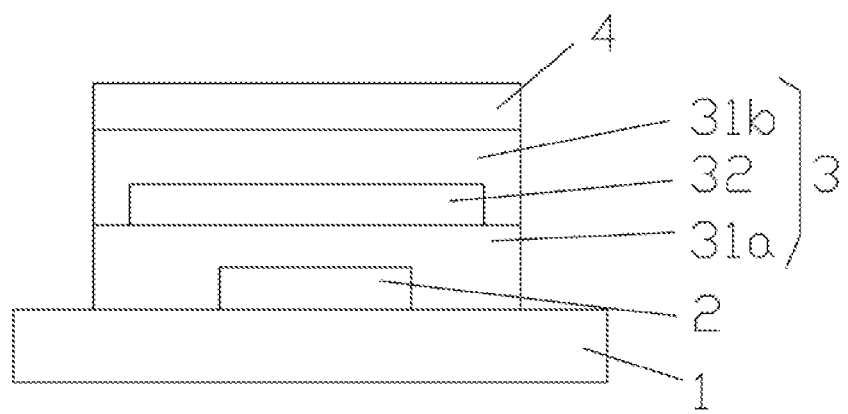
FIG. 1 is a structural diagram of a package structure according to an embodiment of the present disclosure.

Referring to FIG. 1, an embodiment of the present disclosure provides a package structure including a substrate 1, a package stack 3, and an additional layer 4. An OLED device 2 is disposed on the substrate 1, and the package stack 3 encases the OLED device 2 to play a role of blocking water and oxygen. The additional layer 4 is disposed on the package stack 3. The additional layer 4 may be used as a planarization layer to meet the requirements of a subsequent process such as integration of a touch panel and the like, so that there is no need to deposit another planarization layer and the manufacturing procedure is simplified.

At the same time, an entire film layer of the package stack 3 may be also etched by using the additional layer 4 as a photo mask layer, so that the pattern of the package stack may be formed without using a metal mask plate in the prior art, thereby one mask process is saved and the manufacturing procedure is simplified. Moreover, the use of the additional layer 4 as the photo mask layer may also prevent acid solution and alkali solution from being used when the pattern of the package stack is formed, thereby the possibility of damage to the display panel is reduced. In addition, since the metal mask plate is not required, the layer with non-uniform thickness due to the metal mask plate may not be formed, so that a narrow bezel may be realized.

Figure 2:
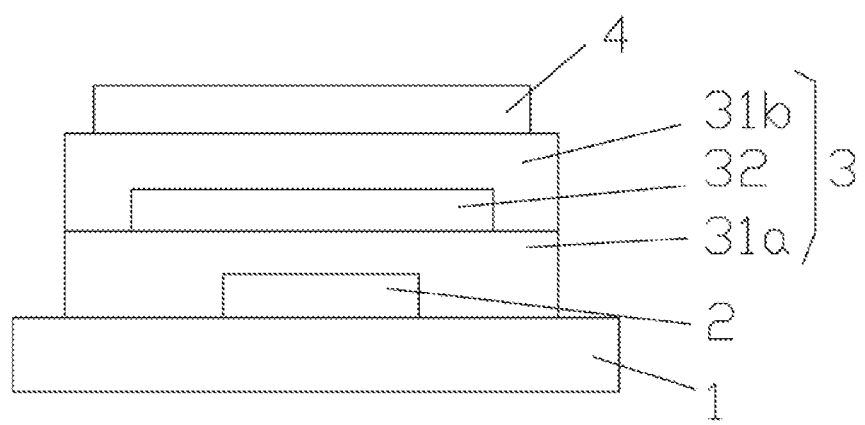
FIG. 2 is a structural diagram illustrating that an entire film layer of a package stack is to be etched by using an additional layer as a photo mask layer to form the package structure according to the embodiment of the present disclosure.

FIG. 2 shows a structural diagram illustrating the entire film layer of the package stack 3 is to be etched. As shown in FIG. 2, portions of the entire film layer of the package stack 3 not covered by the additional layer 4 may be removed by etching the entire film layer of the package stack 3 with the additional layer 4 as a photo mask layer, and finally the profile size of the package stack 3 is identical to that of the additional layer 4.

In some embodiments, an orthographic projection of the additional layer 4 on the substrate 1 coincides with an orthographic projection of the package stack 3 on the substrate 1. Thus, after etching the entire film layer of the package stack 3 with the additional layer 4 as the photo mask layer, a desired bezel size may be obtained. Thus, a narrow bezel may be obtained and the package stack may be formed with a reduced accuracy, and the cost may be reduced. Certainly, in practical applications, the profile size of the additional layer 4 may also be larger than that of the desired package stack, in which case the additional layer 4 may be etched to obtain a desired size.

In practical applications, the additional layer 4 may be made of an organic material, such as a polyurethane-based material, a siloxane-based material, or an acrylate-based material and the like. In some embodiments, the organic material is photoresist, for example negative photoresist.

In an embodiment, the package stack includes a set of package layers including two inorganic layers 31a, 31b and an organic layer 32, in which orthographic projections of the two inorganic layers 31a, 31b on the substrate 1 are larger than and completely cover the orthographic projection of the organic layer 32 on the substrate 1, so that the organic layer 32 may be completely encased, i.e., an upper surface and all sides of the organic layer 32 are encased. The two inorganic layers 31a, 31b are used for blocking water and oxygen and the organic layer is used for releasing stress generated in the inorganic layers and for flattening. Certainly, in practical applications, there may be two or more sets of package layers which are sequentially stacked.

In practical applications, a thickness of the inorganic layer may range from 1000 to 20000 Å. A thickness of the organic layer may range from 1 to 20 μm. Further, a material of the organic layer includes a polyurethane-based material, a siloxane-based material, or an acrylate-based material. In some embodiments, the organic layer may be made of the same material as the additional layer 4. A material of the inorganic layer includes silicon nitride, silicon oxynitride, silicon oxide, titanium oxide or aluminum oxide.

Figure 3:
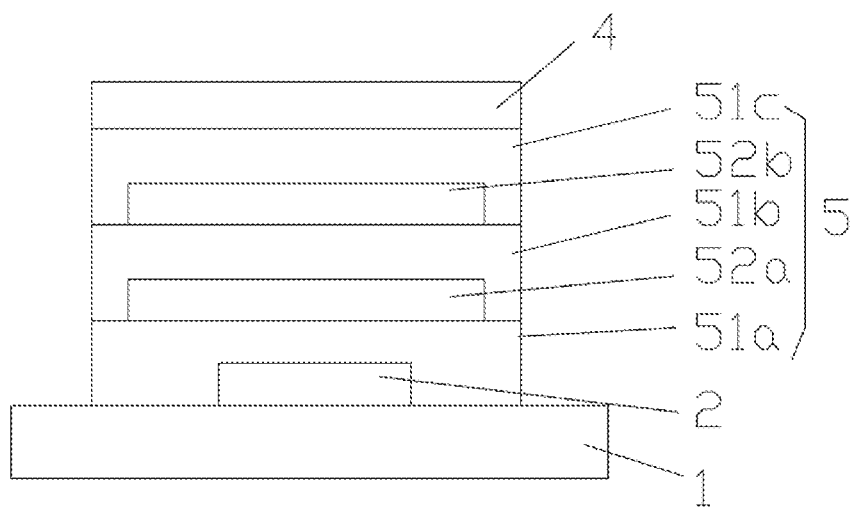
FIG. 3 is a structural diagram of a package structure according to an embodiment of the present disclosure.

FIG. 3 shows a package structure provided by an embodiment of the present disclosure, which differs from the above-described embodiment shown in FIG. 1 merely in the package stack. Only the differences between the embodiment shown in FIG. 3 and the embodiment described above shown in FIG. 1 will be described in detail below.

Specifically, the package stack 5 includes a set of package layers including three inorganic layers 51a, 51b, 51c and two organic layers 52a, 52b, in which one organic layer is disposed between every two adjacent inorganic layers, that is, the organic layer 52a is disposed between the inorganic layer 51a and the inorganic layer 51b, and the organic layer 52b is disposed between the inorganic layer 51b and the inorganic layer 51c. Moreover, orthographic projections of every two adjacent inorganic layers on the substrate 1 are larger than and completely cover an orthographic projection of the organic layer between the two adjacent inorganic layers on the substrate 1, so that the organic layer may be completely encased.

However, the structure of the package stack is not limited thereto. For example, the package stack may include a set of package layers including N+1 inorganic layers and N organic layers, where N is a positive integer, and orthographic projections of every two adjacent inorganic layers on the substrate are larger than and completely cover an orthographic projection of the organic layer between the two adjacent inorganic layers on the substrate.

In summary, in the package structure provided by the above various embodiments of the present disclosure, the package stack may be etched with an additional layer as a photo mask layer by providing the additional layer on the package stack, so that a pattern of the package stack may be formed without using a metal mask plate. Thus, one mask process may be saved, and the additional layer may be also used as a planarization layer to meet requirements of a subsequent process such as integration of a touch panel and the like, so that no additional planarization layer is needed, which simplifies the manufacturing procedure. In addition, since the metal mask plate is not required, a film with non-uniform thickness due to the metal mask plate may not be formed, so that a narrow bezel may be realized.

Figure 4:
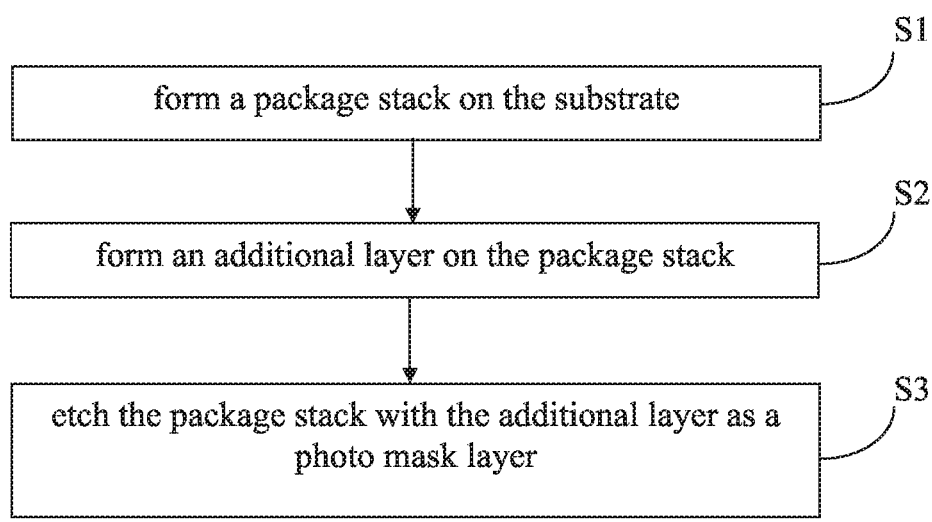
FIG. 4 is a flow chart of a manufacturing method of a package structure according to an embodiment of the present disclosure.

Referring to FIG. 1 and FIG. 4, the present disclosure further provides a manufacturing method of the package structure.

In step S1, a package stack 3 is formed on a substrate 1.

In step S2, an additional layer 4 is formed on the package stack 3.

In step S3, the package stack 3 is etched with the additional layer 4 as a photo mask layer such that portions of the package stack 3 not covered by the additional layer 4 are removed.

The package stack 3 may be etched with the additional layer 4 as a photo mask layer by providing the additional layer 4 on the package stack 3, so that a pattern of the package stack 3 may be formed without using a metal mask plate. Thus, one mask process may be saved, and the additional layer 4 may be used as a planarization layer to meet requirements of a subsequent process such as integration of a touch panel and the like, so that no additional planarization layer is needed, which simplifies the manufacturing process. In addition, since the metal mask plate is not required, a film with non-uniform thickness due to the metal mask plate may not be formed, so that a narrow bezel may be realized.

In practical applications, the additional layer 4 may be formed on the package stack 3 by using a method such as ink jet printing, screen printing, or plasma enhanced chemical vapor deposition and the like.

The step S1 further includes forming at least one set of package layers.

Each of the at least one set of package layers includes N+1 inorganic layers and N organic layers, in which N is a positive integer, and orthographic projections of every two adjacent inorganic layers on the substrate are larger than and completely cover an orthographic projection of the organic layer between the two adjacent inorganic layers on the substrate and the organic layer is completely encased.

As shown in FIG. 1, when N=1, each set of package layers includes two inorganic layers 31a, 31b and an organic layer 32, in which orthographic projections of the two inorganic layers 31a, 31b on the substrate 1 are larger than and completely cover an orthographic projection of the organic layer 32 on the substrate 1, so that the organic layer is completely encased.

In some embodiments, the package stack may also be the structure shown in FIG. 3.

That is, when N=2, each set of package layers includes three inorganic layers 51a, 51b, 51c and two organic layers 52a, 52b, in which one organic layer is disposed between every two adjacent inorganic layers, and orthographic projections of the two adjacent inorganic layers on the substrate are larger than and completely cover an orthographic projection of the organic layer on the substrate 1, so that the organic layer may be completely encased.

In some embodiments, the inorganic layer may be formed by plasma enhanced chemical vapor deposition, atomic layer deposition, or sputter deposition.

In some embodiments, the organic layer may be formed by using ink jet printing, screen printing, or plasma enhanced chemical vapor deposition.

In another embodiment, the present disclosure further provides a display panel including a substrate, and the above package structure provided by the present disclosure. The package structure is disposed on the substrate.

It should be understood that the foregoing implementations are merely exemplary implementations used for describing the principle of the present disclosure, but the present disclosure is not limited thereto. Those ordinary skilled in the art may make various variations and improvements without departing from the spirit and essence of the present disclosure, and these variations and improvements also fall into the protection scope of the present disclosure.

What is claimed is:

1. A package structure, comprising:
a package stack disposed on a substrate; and
an additional layer disposed on the package stack,
wherein the package stack comprises at least one set of package layers; each of the at least one set of package layers comprises N+1 inorganic layers and N organic layers, and N is a positive integer; and orthographic projections of every two adjacent inorganic layers on the substrate are larger than and completely cover an orthographic projection of an organic layer between the two adjacent inorganic layers on the substrate, and the organic layer is completely encased.

2. The package structure according to claim 1, wherein an orthographic projection of the additional layer on the substrate coincides with an orthographic projection of the package stack on the substrate.

3. The package structure according to claim 1, wherein N=1, each set of package layers comprises two inorganic layers and one organic layer, and orthographic projections of the two inorganic layers on the substrate are larger than and completely cover an orthographic projection of the organic layer on the substrate.

4. The package structure according to claim 1, wherein N=2, each set of package layers comprises three inorganic layers and two organic layers, and one organic layer is disposed between every two adjacent inorganic layers, and orthographic projections of the two adjacent inorganic layers on the substrate are larger than and completely cover an orthographic projection of the organic layer on the substrate.

5. The package structure according to claim 1, wherein a thickness of the inorganic layer ranges from 1000 to 20000 Å.

6. The package structure according to claim 1, wherein the organic layer is made of the same material as the additional layer.

7. The package structure according to claim 1, wherein a thickness of the organic layer ranges from 1 to 20 μm.

8. The package structure according to claim 1, wherein the additional layer is made of an organic material.

9. The package structure of claim 8, wherein the organic material comprises a polyurethane-based material, a siloxane-based material, an acrylate-based material, or photoresist.

10. The package structure according to claim 1, further comprising an OLED device disposed on the substrate, wherein the OLED device is encased by the package stack.

11. The package structure according to claim 1, wherein the additional layer is a planarization layer.

12. A display panel, comprising a substrate and the package structure according to claim 1, wherein the package structure is disposed on the substrate.

13. A manufacturing method of the package structure of claim 1, comprising steps of:
forming a package stack on a substrate;
forming an additional layer on the package stack;
etching the package stack with the additional layer as a photo mask layer to remove portions of the package stack not covered by the additional layer.

14. The manufacturing method of a package structure according to claim 13, wherein the additional layer is formed on the package stack by using ink jet printing, screen printing or plasma enhanced chemical vapor deposition.

15. The manufacturing method of a package structure according to claim 13, wherein the step of forming a package stack on a substrate comprises:
forming at least one set of package layers on the substrate such that each of the at least one set of package layers comprises N+1 inorganic layers and N organic layers, and N is a positive integer; and orthographic projections of every two adjacent inorganic layers on the substrate are larger than and completely cover an orthographic projection of an organic layer between the two adjacent inorganic layers on the substrate, and the organic layer is completely encased.

16. The manufacturing method of a package structure according to claim 15, wherein N=1, each set of package layers comprises two inorganic layers and one organic layer, and orthographic projections of the two inorganic layers on the substrate are larger than and completely cover an orthographic projection of the organic layer on the substrate.

17. The manufacturing method of a package structure according to claim 15, wherein N=2, each set of package layers comprises three inorganic layers and two organic layers, and one organic layer is disposed between every two adjacent inorganic layers, and orthographic projections of the two adjacent inorganic layers on the substrate are larger than and completely cover an orthographic projection of the organic layer on the substrate.

18. The manufacturing method of a package structure according to claim 15, wherein the inorganic layer is formed by using plasma enhanced chemical vapor deposition, atomic layer deposition or sputter deposition.

19. The manufacturing method of a package structure according to claim 15, wherein the organic layer is formed by using ink jet printing, screen printing or plasma enhanced chemical vapor deposition.

\* \* \* \* \*